(12) United States Patent
Seki et al.

(10) Patent No.: US 6,560,256 B1
(45) Date of Patent: May 6, 2003

(54) LASER DRIVING APPARATUS, DRIVING METHOD THEREOF, AND IMAGE-FORMING APPARATUS USING IT

(75) Inventors: Yuichi Seki, Omiya (JP); Takashi Nakahara, Moriya-machi (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/447,285

(22) Filed: Nov. 23, 1999

(30) Foreign Application Priority Data

Nov. 25, 1998 (JP) ........................................... 10-334456
Nov. 18, 1999 (JP) ........................................... 11-328281

(51) Int. Cl.[7] ............................................... H01S 3/00
(52) U.S. Cl. .................... 372/38.02; 250/205; 347/246; 347/247
(58) Field of Search ...................... 372/38.02; 250/205; 347/246, 247

(56) References Cited

U.S. PATENT DOCUMENTS

| | | | |
|---|---|---|---|
| 4,876,442 A | 10/1989 | Fukushima | 250/205 |
| 4,935,615 A | 6/1990 | Eiichi et al. | 250/205 |
| 4,985,896 A | 1/1991 | Kimizuka et al. | 372/38 |
| 5,373,518 A | * 12/1994 | Uchiyama et al. | 372/38.02 |
| 5,504,517 A | 4/1996 | Takashi et al. | 347/246 |
| 5,677,723 A | 10/1997 | Soya et al. | 347/247 |
| 5,726,437 A | * 3/1998 | Ashikaga et al. | 250/205 |
| 5,822,343 A | * 10/1998 | Coleman | 372/31 |
| 6,055,252 A | * 4/2000 | Zhang | 372/34 |
| 6,266,078 B1 | * 7/2001 | Koga et al. | 347/236 |
| 6,347,105 B1 | * 2/2002 | Nakayama et al. | 372/38.07 |

FOREIGN PATENT DOCUMENTS

| | | |
|---|---|---|
| JP | 56-140477 | 11/1981 |
| JP | 61-224478 | 10/1986 |
| JP | 62-227667 | 10/1987 |
| JP | 6-36329 | 2/1994 |
| JP | 8-116114 | 5/1996 |
| JP | 10-209545 | 8/1998 |

* cited by examiner

*Primary Examiner*—Paul Ip
*Assistant Examiner*—Cornelius H Jackson
(74) *Attorney, Agent, or Firm*—Fitzpatrick, Cella, Harper & Scinto

(57) ABSTRACT

A laser driving apparatus which includes a plurality of laser emitting elements, a light receiving element for monitoring amounts of light from the plurality of laser emitting elements, and a current-voltage converter for converting a light amount monitor current outputted from the light receiving element to a light amount monitor voltage. The laser driving apparatus also includes a control circuit for controlling a drive current of each of the plurality of laser emitting elements, based on the light amount monitor voltage outputted from the current-voltage converter. The current-voltage converter includes a common resistor and a plurality of non-common resistors, wherein the common resistor is connected to said light receiving element, and each of the plurality of non-common resistors is connectable to the common resistor through a respective switch and is connected to the control circuit.

7 Claims, 6 Drawing Sheets

LASER DRIVING APPARATUS, DRIVING METHOD THEREOF, AND IMAGE-FORMING APPARATUS USING IT

BACKGROUND OF THE INVENTION

1. Field of the Invention

The present invention relates to a multi-laser driving apparatus and an adjusting method thereof and further to an image-forming apparatus having the multi-laser driving apparatus.

2. Related Background Art

A laser driving control method in the image-forming apparatus using multiple lasers is a feedback method of monitoring amounts of light emitted from laser diodes, from current values of a photodiode and, if necessary, properly adjusting driving currents of the laser diodes with reference to the light amounts.

In this method, adjustment is necessary for uniformizing relations of amounts of the light emitted from the laser diodes to the monitor currents of the photodiode. In the multiple lasers, the monitor currents have delicate difference or variation between the laser diodes, and thus an independent adjusting circuit is given to each of the laser diodes to carry out an adjustment operation individually.

FIG. 7 is a block diagram to explain a laser driving control circuit according to a prior art example.

Reference symbol 1 designates a multi-beam laser, 1a a laser diode 1 (LD1), 1b a laser diode 2 (LD2), and 1c a photodiode (PD) for monitoring amounts of light from LD1 and LD2. In order to control the multi-beam laser 1, this circuit is comprised of LD1 drive control circuit 51 and LD2 drive control circuit 52.

The operation of the LD1 drive control circuit 51 will be described schematically. In adjustment of LD1, monitor current 1 switch (SW) 8a and initial adjusting resistor 102 are selected to the LD1 drive control circuit 51 from a monitor current select signal 7. The monitor current (Im) outputted from PD passes through a line 4 to be converted to a monitor voltage (Vm) by the initial adjusting resistor 102, LD2 final adjusting resistor 9, and fixed resistor 101. The monitor voltage is amplified by gain amplifier 10 and thereafter is inputted into a comparator 12 to be compared with the reference voltage a of 11. Numeral 13 denotes a sample-hold circuit, which charges a hold capacitor 15 when the reference voltage a 11 is greater than the monitor voltage (Vm) in sampling according to a sample-hold signal 14, but discharges the hold capacitor 15 otherwise. The voltage appearing at the hold capacitor 15 is inputted into a drive amplifier 16 to cause a current set by drive current setting resistor 18 to flow into the collector of drive transistor 17. When a switching transistor 19 is turned on by a laser modulation signal 21, it allows the current from the laser diode 1 of 1a to flow to bring about emission of light. The operation of the LD2 drive control circuit 3 is similar to that of the LD1 drive control circuit 2, and thus description thereof is omitted herein.

In the prior art example described above, the adjustment operation for the multi-beam laser is multiple; for example, in the case of a two-beam laser, the adjustment operation is double that of a single laser. In other words, the adjustment operation has to be carried out for each of single lasers.

Namely, in the case of the structure of the above prior art example, the adjustment had to be carried out in such a manner that for the laser diode 1 the initial adjusting resistor 102 was first adjusted and the final adjusting resistor 9 was adjusted thereafter and that for the laser diode 2 the initial adjusting resistor 105 was first adjusted and the final adjusting resistor 26 was adjusted thereafter.

SUMMARY OF THE INVENTION

The present invention has been accomplished in order to solve the above problem and an object of the present invention is to provide a multi-laser driving apparatus and an adjusting method thereof capable of saving the load of the adjusting step, or an image-forming apparatus having such a multi-laser driving apparatus.

A multi-laser driving apparatus according to the present invention is a laser driving apparatus comprising:

a plurality of laser emitting elements;

a light receiving element for monitoring amounts of light from said laser emitting elements;

current-voltage converting means for converting a light amount monitor current outputted from said light receiving element to a light amount monitor voltage; and control means for controlling a drive current of each of said plurality of laser emitting elements, based on said light amount monitor voltage outputted from said current-voltage converting means, wherein said current-voltage converting means comprises a common resistor and a plurality of non-common resistors, said common resistor being connected to said light receiving element and to each of said plurality of non-common resistors, and wherein each of said non-common resistors is connected to said common resistor through switching means and connected to said control means.

A driving method according to the present invention is a laser driving method in which a light receiving element receives light from a laser emitting element, current-voltage converting means converts a monitor current outputted from the light receiving element to a monitor voltage, and control means controls a drive current of the laser emitting element, based on said monitor voltage, wherein said current-voltage converting means comprises a common resistor and a non-common resistor and said common resistor together with said non-common resistor, is used for converting said monitor current corresponding to emission of light from each of a plurality of said laser emitting elements, to said monitor voltage, and wherein the non-common resistor together with said common resistor converts said monitor current of a laser emitting element selected from said plurality of laser emitting elements, to said monitor voltage.

An image-forming apparatus according to the present invention comprises the laser driving apparatus described above.

DETAILED DESCRIPTION OF THE PREFERRED EMBODIMENTS

Figure 1:
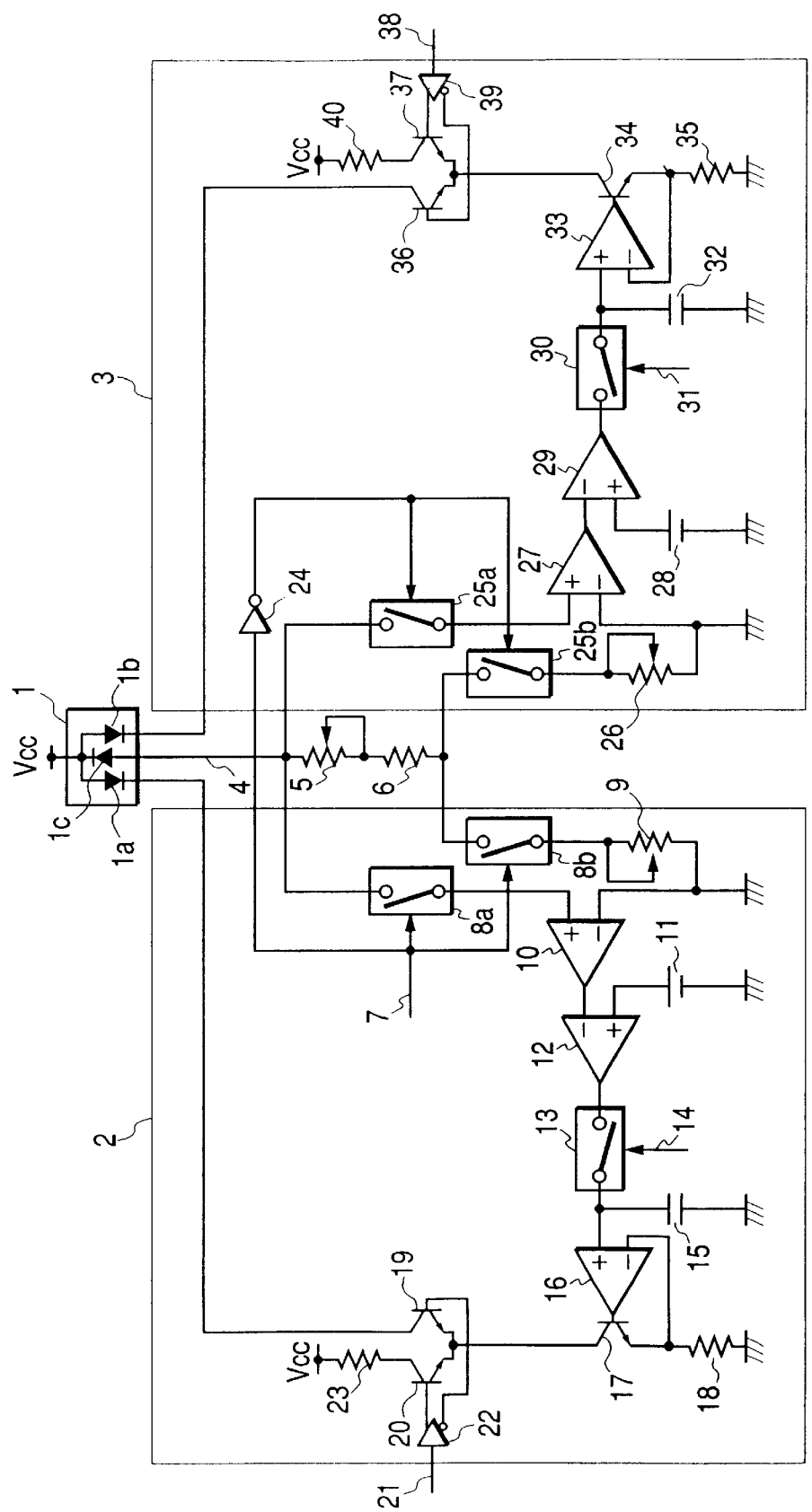
FIG. 1 is a block diagram of a laser driving circuit in an embodiment of the present invention.

FIG. 1 is a block diagram to explain a laser drive control circuit, which is an embodiment of the present invention.

Reference symbol 1 designates a multi-beam laser, 1a a laser diode 1 (LD1), 1b a laser diode 2 (LD2), and 1c a photodiode (PD) for monitoring amounts of light from LD1 and LD2. For controlling the multi-beam laser 1, this circuit has an LD1 drive control circuit 2 and an LD2 drive control circuit 3 and is comprised of an initial adjusting resistor Rm1 5 and a fixed resistor Rms 6 which are common to these drive control circuits. The initial adjusting resistor Rm1 5 is a resistor capable of being set variably at a desired resistance.

The operation of the LD1 drive control circuit 2 will be described schematically. In the adjustment of LD1, monitor current 1 switches (SWs) 8a, 8b are selected to the LD1 drive control circuit 2 from a monitor current select signal 7. The switch 8b is connected in a switchable state between the fixed resistor Rms 6 and a final adjusting resistor Rm2 9. The monitor current (Im) 4 outputted from PD is converted to a monitor voltage (Vm) by the initial adjusting resistor Rm1 5, the LD2 final adjusting resistor Rm2 9, and the fixed resistor Rms 6. The initial adjusting resistor 5 and fixed resistor 6 are common resistors used for the adjustment operations of both LD1 and LD2. The monitor voltage is then sent to a control means having at least a gain amplifier (amplifying means) 10, a comparator (comparing means) 12, and a reference voltage generating means 11. The monitor voltage is amplified by the gain amplifier 10 and thereafter is inputted into the comparator 12 to be compared with the reference voltage a (Vref) of the reference voltage generator 11. Numeral 13 denotes a sample-hold circuit, which charges a hold capacitor 15 when the reference voltage a 11 is greater than the monitor voltage (Vm) in sampling according to a sample-hold signal 14, but discharges the hold capacitor 15 otherwise. The voltage appearing at the hold capacitor 15 is inputted into a drive amplifier 16 to cause the current set by a drive current setting resistor 18 to flow into the collector of a drive transistor 17. When a switching transistor 19 is turned on by a laser modulation signal 21, it allows the current from the laser diode 1 of 1a to flow, thereby effecting emission of light. Since the operation of the LD2 drive control circuit 3 is similar to that of the LD1 drive control circuit 2 except that monitor current 2 switches (SWs) 25a, 25b are selected to the LD2 drive control circuit 3 from the monitor current select signal 7, the description thereof is omitted herein.

In FIG. 1, numeral 24 represents an inverter, 25 monitor current 2 switches (SWs), 26 an LD2 final adjusting resistor Rm2', 27 a gain amplifier b, 28 a reference voltage b, 29 a comparator b, 30 a sample-hold circuit b, 31 a sample-hold signal b, 32 a sample-hold capacitor b, 33 a drive amplifier b, 34 a drive transistor b, 35 a drive current setting resistor b, 36 a switching transistor b, 37 a load resistor drive transistor b, 38 a laser modulation signal b, 39 a differential driver b, and 40 a laser load resistor.

[Setting of Adjustment Resistances]

Figure 2:
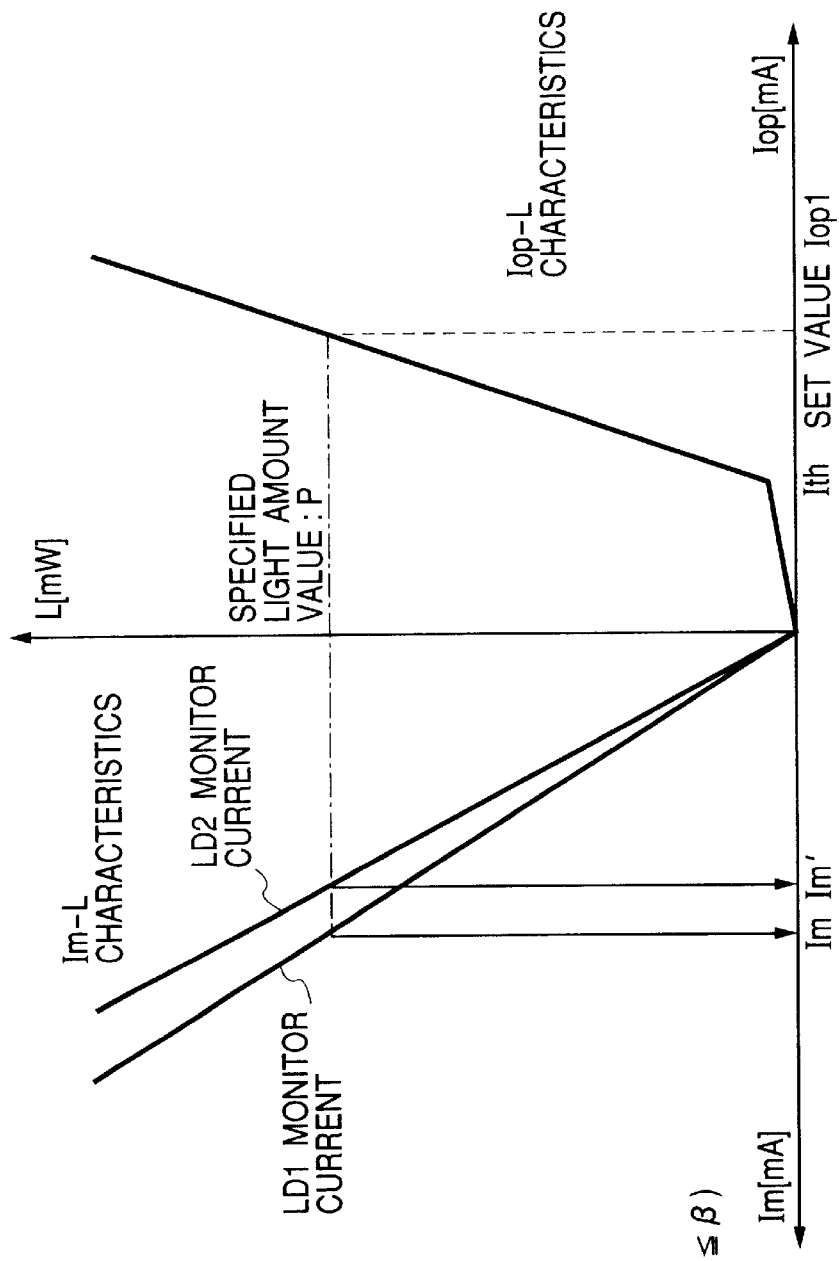
FIG. 2 is a graph to show laser driving current versus emission characteristics and monitor current versus emitted light amount characteristics in the embodiment of the present invention.

FIG. 2 is a graph to show the laser drive current Iop-emitted light amount L characteristics and the monitor current Im-emitted light amount L characteristics. In the graph, the graph to show the Iop-L characteristics is illustrated on the right side of the axis of L [mW] indicating the emitted light amount L, and the graph to show the Im-L characteristics on the left side of the axis of L [mW]. The relations of current values Iop, Im to emitted light amount L can be approximated each to a linear function. Concerning the monitor current Im-emitted light amount L characteristics, there is delicate variation between the monitor currents for LD1 and LD2 at a given light amount, depending upon structures of the laser diodes, i.e., finish conditions of the individual laser diodes. In order to show the variation, two linear functions are graphed on the left side of the axis L [mW] in FIG. 2.

Let us define a specified light amount value as P and suppose the following.

LD1 monitor current $Im = P/\alpha$ (1)

LD2 monitor current $Im' = P/\beta$ (2)

(where $\alpha$ and $\beta$ are constants satisfying $\alpha \leq \beta$)
Then the following relation holds.

$$Im \geq Im'$$ (3)

The prime mark "'" will be used hereinafter for expressing each of symbols related to LD2.

Since the condition is that the feedback loop in the laser current control circuit at the specified light amount is in an equilibrium state, a total set resistance (Rm, Rm') of the adjusting resistors for each of the laser diode 1 and the laser diode 2 is determined uniquely from the reference voltage value Vref and each monitor current value (Im or Im').

LD1 total set resistance $Rm = Rm1 + Rm2 + Rms$ (4)

LD2 total set resistance $Rm' = Rm1 + Rm2' + Rms$ (5)

(In Eqs. (4) and (5) Rm1 and Rms are common and Rm2' is the final adjusting resistor concerning LD2.)
Then the following equations hold.

$Rm = Vref/Im = \alpha \cdot Vref/P$ (6)

$Rm' = Vref/Im' = \beta \cdot Vref/P$ (7)

$Rm \leq Rm'$ ($\because \alpha \leq \beta$) (8)

In the present invention we assume Rm1>Rm2 and Rm1>Rm2'.

On the other hand, giving consideration to the fact that the specified light amount value has a certain width because of variation of optics etc., maximums (Rmmax, Rm'max) are set for the total set resistances of the adjusting resistors. These maximums need to be set so as to be not less than the resistance at the minimum specified light amount. Let the set maximums of the initial adjusting resistor Rm1 and the final adjusting resistors for LD1, LD2 be Rm1max, Rm2max, and Rm'2max and let the monitor currents at the minimum specified light amount be Immin and Im'min, respectively. Then the following relations hold.

$Rm\max[= Rm1\max + Rm2\max + Rms] > Vref/Im\min$ (9)

$Rm > Vref/Im\min$ $$Rm'\max[=Rm1\max+Rm'2\max+Rms]>Vref/Im'\min \quad (10)$$

$$Rm>Vref/Im'\min$$

$$Rm\max \leq Rm'\max \quad (\because Im\min \geq Im'\min)$$

Likewise, consideration is also given to conditions upon maximum specified emission. Then minimums (Rmmin, Rm'min) are also set for the total set resistances of the adjusting resistors upon the maximum specified emission. These minimums are expressed by the following equations. Supposing these minimums are the fixed resistance Rms, the following relations are derived from the above argument.

$$Rm\min[=Rms]<Vref/Im\max \quad (11)$$

$$Rm'\min[=Rms]<Vref/Im'\max \quad (12)$$

Here Immax, Im'max represent the monitor currents at the maximum specified light amount.

Since the fixed resistance Rms is common, the following relation can be derived.

$$Rm\min=Rm'\min=Rms<Vref/Im\max \leq Vref/Im'\max \quad (13)$$

However, since the initial adjusting resistor Rm1 is common, there occurs a difference $\Delta R$ between the resistance after the initial adjustment and each total set resistance (Rm, Rm'). Since the final adjusting resistors (Rm2, Rm2') need to be set at a value enough to absorb the variation of each monitor current, the following equations have to be satisfied.

$$Rm2>\Delta R=Vref/Im'-Vref/Im$$

$$Rm2'>\Delta R=Vref/Im'-Vref/Im$$

$$(\because Im>Im') \quad (14)$$

From the above argument, the setting conditions of the adjusting resistors are as follows.

$$Rm=Vref/Im=Rm1+Rm2+Rms$$

$$Rm'=Vref/Im'=Rm1+Rm2'+Rms$$

$$Vref/Im\min<Rm$$

$$Vref/Im'\min<Rm'$$

$$Rm1>Rm2$$

$$Rm1>Rm2'$$

$$Rm2>Vref/Im'-Vref/Im$$

$$Rm2'>Vref/Im'-Vref/Im$$

$$Rms<Vref/Im\max$$

$$(\because Im \geq Im')$$

[Adjusting Method]

Figure 3:
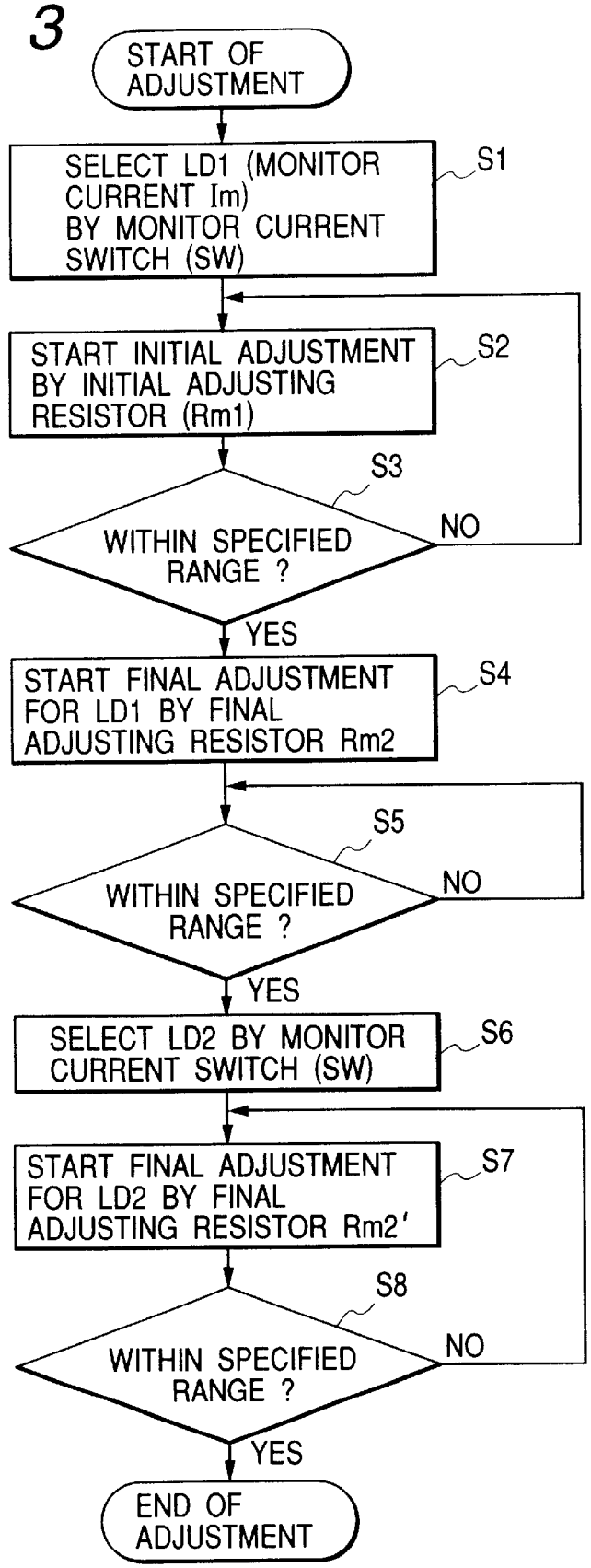
FIG. 3 is a flowchart to show an adjusting method of the laser driving circuit in the embodiment of the present invention.

FIG. 3 is a flowchart to show the adjusting method. The method will be described herein with an example of the adjusting method using LD1 for the initial adjustment. First, the LD1 monitor current Im is selected by the monitor current switch SW (S1). Then the initial adjustment is started to adjust the initial adjusting resistor Rm1 into the specified range; if it is off the specified range it will be adjusted so as to be within the specified range (S2, S3). Then the adjustment is focused into the final specified range by the LD1 final adjusting resistor Rm2; if the resistance is off the final specified range the resistance will be adjusted into the final specified range (S4, S5). Then the monitor current switches (SWs) are turned to the LD2 side (S6). Since the initial adjustment has already been completed in the steps S2, S3 and can be omitted herein, the final adjustment of LD2 is carried out by the LD2 final adjusting resistor Rm2', thereby completing the adjustment (S7, S8).

Figure 4:
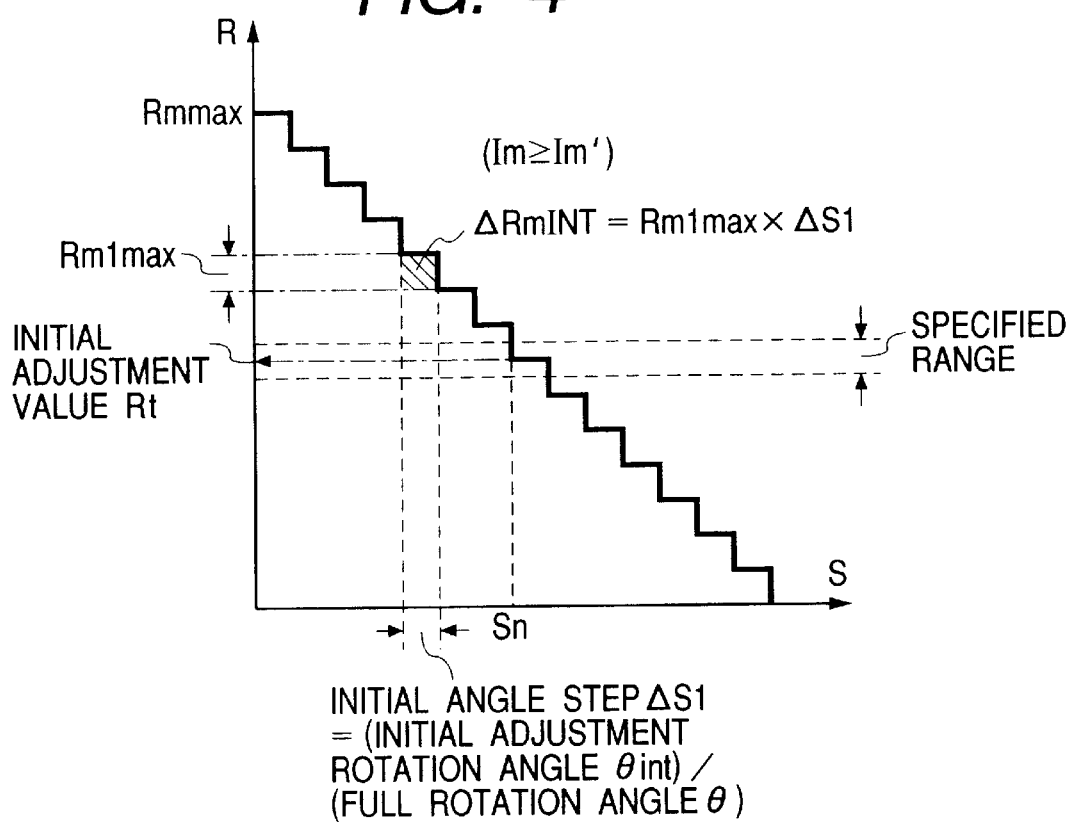
FIG. 4 is a first graph to illustrate the adjustment process of the laser driving circuit in the embodiment of the present invention.

FIG. 4 is a graph to show the relationship between angle step and resistance. In the present embodiment variable resistors of a rotating type, which rotate in steps of equal angles, are used as the adjusting resistors. In that case, an effective rotation angle (full rotation angle) capable of outputting a resistance is represented by $\theta$ and a rotation angle upon the initial adjustment (initial adjustment rotation angle) and a rotation angle upon the final adjustment (final adjustment rotation angle) by $\theta$int and $\theta$end, respectively. A moving angle in each adjustment will be called an angle step. Each adjusting resistor can be varied stepwise by an equal amount both upon the initial adjustment and upon the final adjustment. Angle steps during the respective adjustments will be called an initial angle step $\Delta S1$ and a final angle step $\Delta S2$.

Initial angle step $\Delta S1 = \theta int/\theta$

Final angle step $\Delta S2 = \theta end/\theta$

In the present invention the initial angle step may be set greater than the final angle step. In other words, the steps may be set so as to satisfy $\Delta S1 > \Delta S2$.

A resistance resolution $\Delta RmINT$ in the initial adjustment (i.e., a change amount of resistance per single angular change) can be expressed as follows from the set maximum Rm1max of the initial adjusting resistor and the initial angle step $\Delta S1$.

$$\Delta RmINT=Rm1\max \cdot \Delta S1$$

Figure 5:
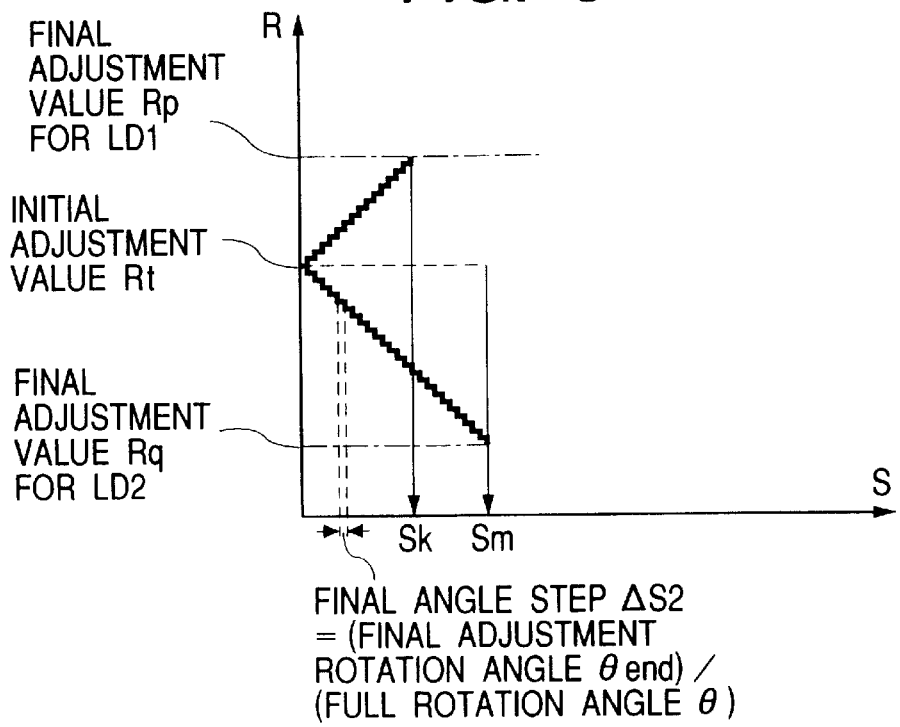
FIG. 5 is a second graph to illustrate the adjustment process of the laser driving circuit in the embodiment of the present invention.

For the adjustments, the adjusting method of gradually increasing the light amount is employed for the purpose of protecting the laser. Then the initial values of the adjusting resistors are started from the maximum. FIG. 5 is a graph to show the relationship between angle step and resistance in the final adjustment. As illustrated in FIG. 5, supposing that the initial adjustment was achieved by the number steps Sn from the initial value of the set resistance into the specified range, the initial adjustment value Rt is given by Rt=Rmmax−$\Delta RmINT \cdot Sn$, where Rmmax is the total resistance of the adjusting resistors. (Reference is made to FIG. 5.)

The resistance resolution $\Delta RmEND$ in the final adjustment of LD1 is expressed as follows from the total resistance Rm2max of the final adjusting resistor and the final angle step $\Delta S2$.

$$\Delta RmEND=Rm2\max \cdot \Delta S2$$

Supposing that the final adjustment of LD2 was achieved by the number of steps Sm into the specified range, the final adjustment value Rt is given by Rp=Rt−$\Delta RmEND \cdot Sm$ from the initial adjustment value Rt. Similarly, the final adjustment value Rp in the final adjustment of LD1 is given by Rp=Rt+$\Delta Rm'END \cdot Sk$, where Sk is the number of required steps and $\Delta Rm'END$ is the resistance resolution.

Figure 6:
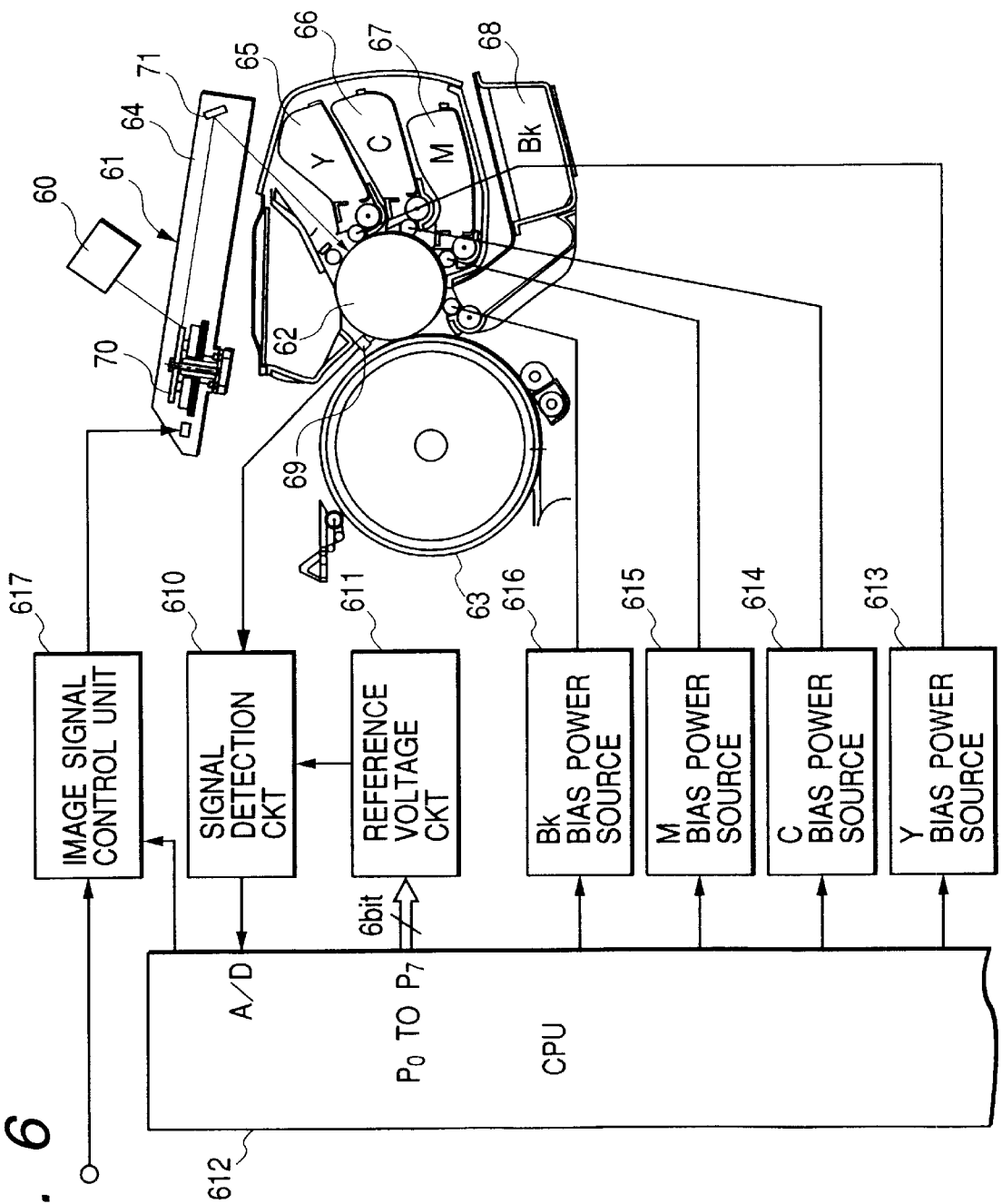
FIG. 6 is a schematic diagram to show an image-forming apparatus of the present invention.
Figure 7:
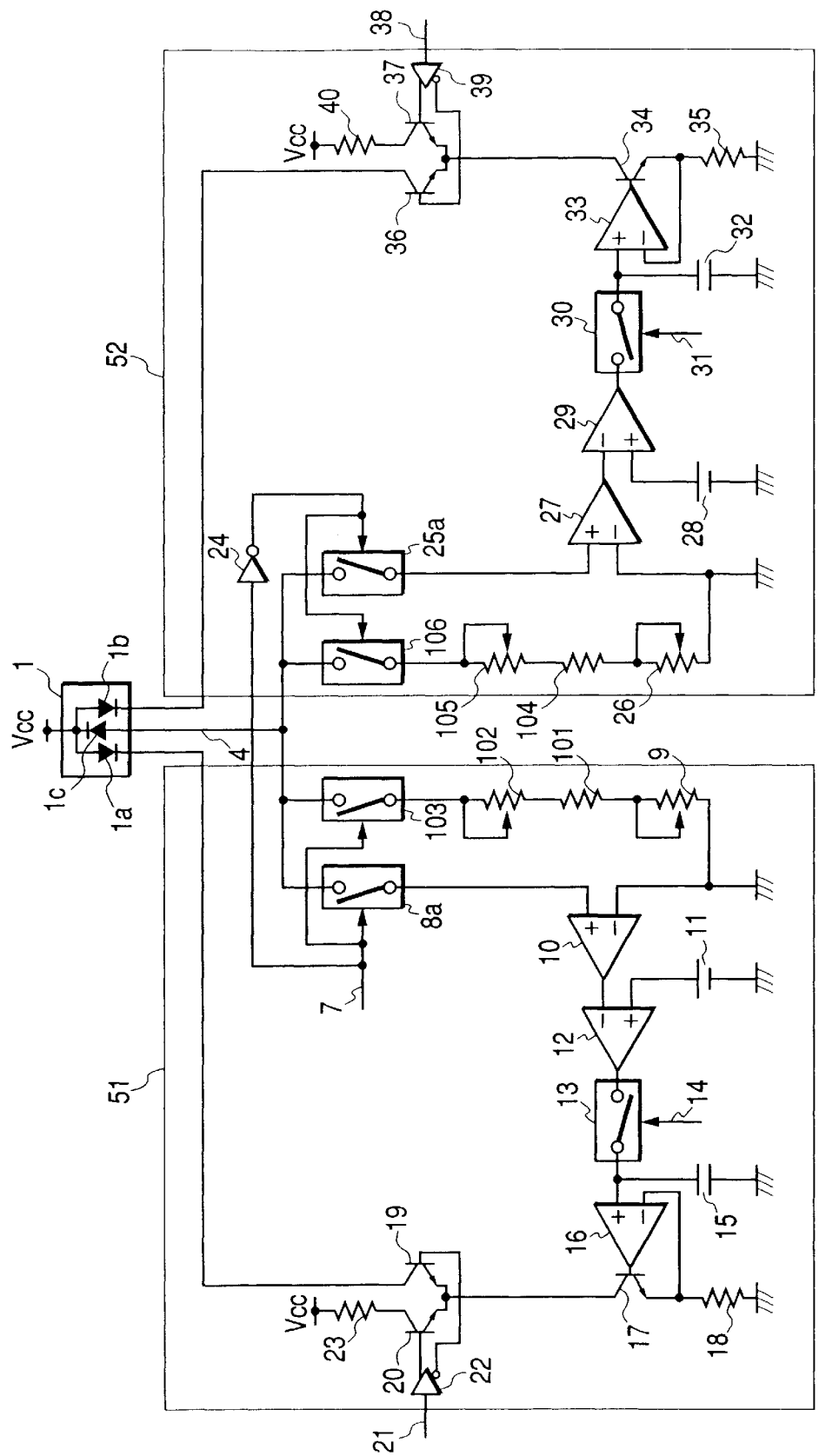
FIG. 7 is a block diagram of the laser driving circuit according to the prior art example.

FIG. 6 is a diagram to show the sectional structure of an image recording apparatus as an embodiment of the present invention and the structure of a density control device installed therein.

In FIG. 6, numeral 61 denotes a color image-forming unit of the electrophotographic method, 62 a photosensitive drum onto which laser beams are guided to form a latent image, and 63 a transfer drum for transferring an image developed from the latent image onto a recording sheet. Numeral 64 designates a laser scanning unit for emitting the laser light indicating an image signal. Numeral 60 represents a light source unit for emitting multiple beams, described previously, which has at least the laser diodes 1, 2, the photodiode (PD), the LD1 drive control circuit 2, and the LD2 drive control circuit 3 illustrated in FIG. 1. Numeral 70 denotes a polygon mirror and 71 a reflecting mirror. The light source unit 60 may also be set in the laser scanning unit 64.

Numeral 65 indicates a developing unit for yellow toner which develops a yellow latent image, 66 a developing unit for cyan toner, 67 a developing unit for magenta toner, and 68 a developing unit for black toner. Numeral 69 stands for a density sensor unit for detecting the density of an image formed on the photosensitive drum 62, 610 for a detecting circuit for detecting a density sensor signal from the density sensor unit 69, and 611 for a reference voltage circuit for supplying the reference voltage to the signal detecting circuit 610. Numeral 612 designates a CPU (central processing unit) for executing the control of the whole of this apparatus.

Further, numeral 613 represents a development bias power supply for the yellow developing unit 65, 614 a development bias power supply for the cyan developing unit 66, 615 a development bias power supply for the magenta developing unit 67, and 616 a development bias power supply for the black developing unit 68.

Described next is the operation of the image recording apparatus having the above structure.

At the color image-forming unit 61, the sensitive drum 62, after charged by a charging unit not illustrated, is exposed to the laser light beams emitted form the laser diodes 1 and 2 and projected from the laser scanning unit 64. The multi-laser beams from the laser scanning unit 64 form a latent image on the surface of the photosensitive drum 62. The light amounts of the respective multi-laser beams are approximately equal. For example, after formation of the yellow latent image, the yellow development bias power supply 613 is actuated to apply the development bias to the yellow developing unit 65 to visualize the yellow latent image with toner. The toner image thus visualized is attracted by transfer high-voltage power applied to the transfer drum 63, whereby it is transferred from the photosensitive drum 62 onto the transfer drum 63.

The above sequential operation is carried out similarly for each of the colors (yellow Y, magenta M, cyan C, and black Bk), whereby a color image is formed on the transfer drum 63. After that, the color image is transferred onto a transfer sheet (not illustrated) and is then fixed to be printed out.

As apparent from the above series of print sequences, the print sequences of the respective colors are independent of each other in the image recording apparatus, so that the toner densities of the respective colors can be detected by measuring the image on the photosensitive drum 62 or on the transfer drum 63 by the density sensor 69. Then toner compounding capable of achieving the optimum image quality can be implemented by controlling the recording condition (the bias herein) in each of the recording processes, using this detection result.

In the present embodiment, therefore, the toner image transferred onto the photosensitive drum 62 is measured by a reflected light amount measuring system including the density sensor 69 and densities of the respective color toners are always combined stably.

As described above, the present invention presents the effects of work saving of the adjusting circuits and reduction of the adjustment time in the drive control circuits of the multi-beam laser. There are cases wherein the number of laser beams needs to be increased, for example to 4, in order to further enhance the quality of image, and the effects of work saving and reduction of the adjustment time become further outstanding in such cases.

What is claimed is:

1. A laser driving apparatus comprising:

first and second laser emitting elements;

a light receiving element for monitoring amounts of light from said first and second laser emitting elements;

a current-voltage converter for converting a light amount monitor current outputted from said light receiving element to a light amount monitor voltage;

control means for controlling a drive current of each of said first and second laser emitting elements, based on the light amount monitor voltage outputted from said current-voltage converter; and switching means for effecting switching between monitor control of said first laser emitting element and monitor control of said second laser emitting element, wherein said current-voltage converter comprises a variable resistor and first and second resistors, and wherein the light amount monitor current outputted from said light receiving element is converted to the light amount monitor voltage through said variable resistor and said first resistor when the monitor control of said first laser emitting element is selected by said switching means, and the light amount monitor current outputted from said light receiving element is converted to the light amount monitor voltage through said variable resistor and said second resistor when the monitor control of said second laser emitting element is selected by said switching means.

2. The laser driving apparatus according to claim 1, wherein said light receiving element is a single light receiving element.

3. The laser driving apparatus according to claim 1, wherein said control means comprises an amplifier for amplifying the light amount monitor voltage, a reference voltage generator for generating a reference voltage, and a comparator for comparing a first output signal of said amplifier with a second output signal of said reference voltage generator.

4. The laser driving apparatus according to claim 3, wherein at least one of said amplifier, said reference voltage generator, and said comparator is arranged so as to permit common control of the drive currents of said first and second laser emitting elements.

5. The laser driving apparatus according to claim 3, wherein said control means further comprises signal holding means for sampling and holding a third output signal of said comparator, based on a sample-hold control signal, a current generator for generating a current according to a signal held by said signal holding means, and a modulator for modulating the current generated by said current generator to a modulation current modulated based on an external video signal.

6. The laser driving apparatus according to claim 1, wherein each of said first and second resistors comprises a variable resistor.

7. The laser driving apparatus according to claim 1, wherein said laser driving apparatus is applied in an image-forming apparatus.

\* \* \* \* \*